(12) United States Patent
Perkins et al.

(10) Patent No.: US 6,392,242 B1
(45) Date of Patent: *May 21, 2002

(54) FIDUCIAL BEAM POSITION MONITOR

(75) Inventors: F. Keith Perkins, Alexandria, VA (US); Daniel McCarthy, Ellicott City, MD (US); Martin C. Peckerar, Silver Spring, MD (US); Christie R. K. Marrian, Marbury, MD (US); Eric S. Snow, Springfield, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/320,673

(22) Filed: May 27, 1999

(51) Int. Cl.$^7$ .............................. G01I 1/00; G01N 21/00
(52) U.S. Cl. ................................. 250/491.1; 250/361 R
(58) Field of Search .......................... 250/491.1, 492.2, 250/361, 367; 430/5; 351/74, 75, 55

(56) References Cited

U.S. PATENT DOCUMENTS 5,136,169 A * 8/1992 Smith et al. ............. 250/491.1
5,703,373 A 12/1997 Peckerar et al.
5,892,230 A * 4/1999 Goodberlet et al. ..... 250/361 R

OTHER PUBLICATIONS

Perkins et al., *J. Vac. Sci. Tech.*, vol. 16, No. 6, p 3567 (May 28, 1998).

* cited by examiner

Primary Examiner—Jack Berman
Assistant Examiner—Johnnie L Smith, II
(74) Attorney, Agent, or Firm—John J. Karasek; John Gladstone Mills, III

(57) ABSTRACT

A fiducial beam monitor includes a patterned diode layer on a semiconducting substrate. An electrical field between the diode (or diodes) on the diode layer and the semiconducting substrate modulates the size of the depletion layer formed by the diode or diode. A high energy beam incident upon a diode on the diode layer produces a greater current than a high energy beam incident upon a non-diodic region of the same layer. In use, the beam monitor is typically fixed to the backside of a workpiece such as a semitransparent membrane being patterned by a focused high energy beam that is translated with respect to workpiece and attached monitor. The changes in current during translation are then correlated with the position of the beam with respect to the pattern on the diode layer.

20 Claims, 2 Drawing Sheets

GENERAL SCHEME OF DETECTOR

GENERAL SCHEME OF DETECTOR

CROSS-SECTION OF PATTERNED DIODE ARRAY

MEANS OF MAKING CONTACT TO DETECTOR TOP SURFACE:
DEEP ETCH AT EDGE

MEANS OF MAKING CONTACT TO DETECTOR TOP SURFACE:
DEPOSITED METAL FILM BRIDGING GAP FROM DETECTOR TO
HOLDER AS AN OVERLAYER ON SOME POTTING COMPOUND

MOUTING THE DETECTOR IN "ZERO CLEARANCE" CONFIGURATION.

FIDUCIAL BEAM POSITION MONITOR

BACKGROUND OF THE INVENTION

1. Field of the Invention

The present invention relates generally to monitoring the position of a beam, and more particularly to monitoring the position of a high energy beam used for patterning surfaces for electronic device manufacturing.

2. Background of the Invention

Pattern placement poses a critical problem in the electron-beam based manufacture of masks for proximity X-ray lithography, for photon beam-based reproduction of masks onto semiconductor wafers, and other devices used for manufacturing electronics. Lithography for 130 nm ground rule demands a 3σ placement accuracy of better than 12 nm. For an x-ray mask, this placement accuracy is required over the entire mask, on the order of 10 cm$^2$ in area, and containing many 100's of millions of individually addressed pixels written at rates on the order of 1 MHz, or above. Unfortunately, several factors contribute to errors in the image placement. Although the absolute position of the stage can be maintained by means of laser interferometry, the same cannot be said of the beam. Instead, beam position is presently maintained as a "best effort", by active control of column element temperature and column electrode potentials, and periodic references to an off-membrane fiducial grid.

The device described in U.S. Pat. No. 5,703,373, issued Dec. 30, 1997, the entirety of which is incorporated herein by reference, addresses this problem by providing a beam detector and integrated fiducial grid which may be used under a transmissive membrane for position monitoring. In that device, a grid of wires or an apertured absorber layer is supported upon a uniform and intact Schottky contact layer. The grid or apertured absorber layer modulates an incident beam transmitted through the mask. That device, although useful, causes some backscattering of the incident beam due to the high atomic number of the materials in the grid or absorber layer. Because grid materials with high atomic number are required to achieve the needed absorption, that device, as designed, cannot avoid backscattering. Additionally, the need for establishing an electrical contact with the upper surface of the device prevented the device's placement directly against the membrane. Because the transmissive membrane (e.g., a mask) causes forward scattering, and thus divergence of the incident beam, the separation between the transmissive membrane and the absorber layer/grid decreases the potential accuracy of the device.

SUMMARY OF THE INVENTION

Accordingly, it is an object of this invention to monitor the position of a high energy beam (such as an electron beam, a uv beam, an x-ray beam, etc.) with a device that results in minimum backscattering of the incident beam.

It is another object of the present invention to increase the accuracy in the formation of patterns using high energy beams.

It is an object of some embodiments of the present invention to allow a fiducial grid for beam monitoring to be placed in physical contact (zero-clearance) or near physical contact (clearance at or below about 10 μm) with the backside of a transmissive membrane being patterned by the beam.

These and additional objects of the invention are accomplished by a semiconducting substrate having an upper surface with a diode layer thereon. The diode layer may be one or more diodes each of which surround a non-diodic region of the diode layer (i.e., a region on the upper surface of the substrate that does not include a depletion layer), or may be a known (predetermined) pattern of diodes which causes the surface to have distinct diode regions and non-diodic regions. Each diode is defined by an interface that forms a depletion layer within the substrate. When struck by an incident particle, the diode or diodes produce a detectable current. By comparing actual changes in current during the relative movement between the beam and the substrate or workpiece with the anticipated changes in current based upon the pattern and the expected relative movement between the substrate or workpiece and the beam, the error in beam position can be determined. Using simple and known algorithms (such as Fourier transform techniques) appropriate for feedback compensation, these errors can be corrected.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

Figure 1:
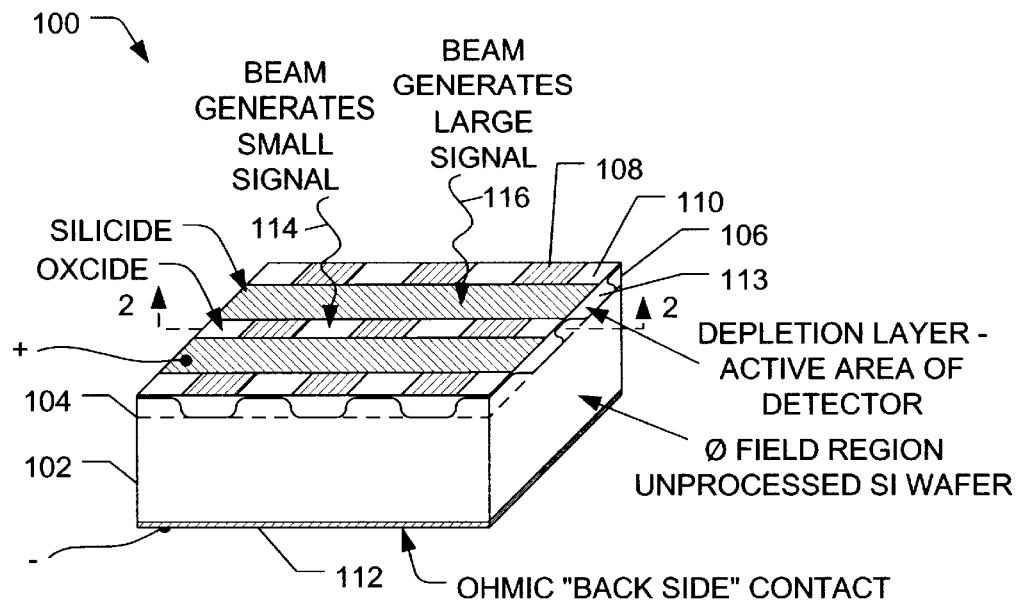
FIG. 1 shows a plan, not to scale view of an exemplary embodiment of a device according to the present invention.

As stated above, the diode layer includes diodic regions and non-diodic regions. These regions may be formed by one or more diodes surrounding a non-diodic region or a plurality of diodes in a known (predetermined) distribution. The purpose behind these distinct diodic and non-diodic regions is to provide, during use. current changes that can be corresponded with relative incident beam position. Although the need to correspond these current changes with the relative incident beam position favors non-random distribution of the diodic and non-diodic regions, these regions may be randomly distributed if they are subsequently mapped so that they provide known reference points. When a plurality of diodes are employed, typical arrangements include an array such as an x-y grid (e.g., overlapping strips) or a radial array.

The substrate that supports the diodic layer should be a semiconductor. Typical semiconductors useful in the present invention include, e.g., Si, GaAs, GaN, InSb, and GaAlAs. Typically, diodic regions are formed within the diode layer by forming a conductive layer on one or more portions of the upper surface of the substrate (i.e., Schottky diode) or a differently doped semiconductor on one or more portions of the upper surface of the substrate. The interface between the conductive layer or a differently doped semiconductor and the semiconducting substrate forms a depletion layer in the underlaying portion of the substrate. The interface and the underlaying depletion layer define the diode.

For the device of the present invention to function, an electrical field must be established across the depletion region. To achieve this field, an electrical contact (Schottky or ohmic) is attached to the upper surface(s) (the surface furthest from the substrate) of the diode or diodes within the depletion layer. This contact may be established, for example, by a conductive overlayer (such as a metal) over the entire diode layer. If this approach is employed, the non-diodic regions of the diode layer should be coated with an insulator prior to deposition of the metal layer to prevent shorting of the substrate to the conductive overlayer. Alternatively, diodes may be individually addressed by an electrical contact (Schottky or ohmic) thereon. This latter approach may, however, increase the profile of the device and subsequently increase the minimum distance required between the workpiece and the diode layer. In all cases, an ohmic contact to the substrate is also provided, so that an electrical field across the depletion region may be established. The ohmic contact to the substrate may be provided at any location on the substrate, provided that the ohmic contact to the substrate is otherwise electrically isolated from electrical contact made to the upper surface of the diodes.

If a conductive overlayer is used to establish electrical contact to the upper surfaces of the diodes, a portion of the upper surface of the substrate may be electrically insulating. This arrangement can allow connection of the conductive overlayer to an electrical source without greatly increasing the profile of the device. For example, a notch may be formed at an edge between the upper surface of the substrate and a side surface of the substrate. An oxide or other insulating layer is formed on the inner surface of the notch. Upon formation or deposition of the conductive overlayer, the conductive overlayer extends into the notch. Thus, a portion of the conductive overlayer is accessible from the side of the device and may be connected, For example by a wire, to an electrical source without creating a projection from the upper surface of the device.

FIG. 1 shows an exemplary embodiment of a beam position detector 100 according to the present invention. Substrate 102 of native Si has an upper surface 104 that support a diode layer 106 (throughout the specification and claims, the terms "upped" and "lower" refer only to relative orientation, and do not indicate gravitational orientation). Diode layer 106 includes two crossed sets of parallel (or otherwise non-intersecting) conductive strips 108 (e.g., of PtSi) in an x-y grid pattern. These conductive strips surround insulating islands 110, in this case of SiO$_2$. An electrical field is generated by biasing the upper surface of conductive strips 108 (via an ohmic or Schottky contact thereto) with respect to substrate 102 (via ohmic backside contact 112). The junction between the conductive strips 1(08 and substrate 102 creates a depletion layer 113, which is the active region of the detector. The remainder of substrate 102 serves as the zero field region. A high energy beam (e.g., a particle beam) 114 incident upon an island 110 generates a small current, while a high energy beam 116 incident upon a conductive strip 108 generates a significantly larger current. Thus, the location of a high energy beam relative to the transmissive membrane may be tracked by corresponding observed current changes with the pattern of diodic and non-diodic regions on diode layer 106. This tracking can readily be used to correct errors in beam placement using known feedback correction techniques, such as algorithms based on Fourier transformations.

Figure 2:
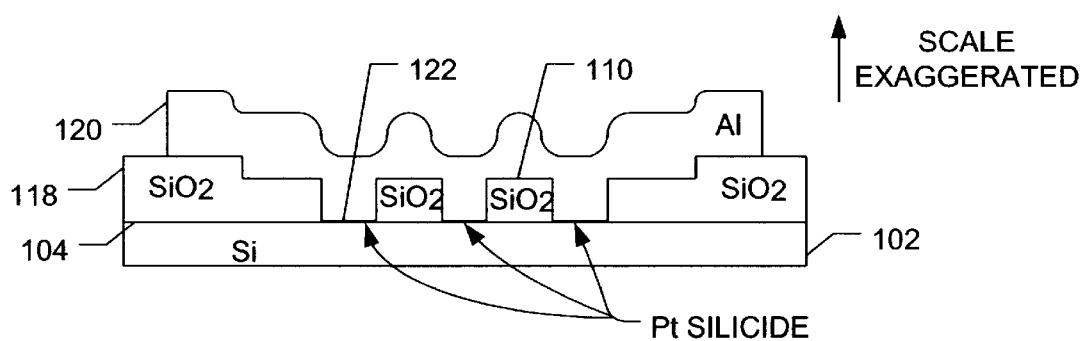
FIG. 2 shows a not to scale cross-section of the device shown in FIG. 1, taken along line 2—2.

As suggested by the cross section view of FIG. 2 (taken along line 2—2 in FIG. 1), conductive strips 108 surrounding insulating islands 110 may be formed, for example, by providing insulating layer 118 (for example SiO$_2$) over upper surface of substrate 102 and removing the insulating layer down to at least the upper surface of the substrate and typically somewhat below (typically by a suitable etching process, such as chemical etching) at those regions where conductive strips 108 will be formed. Conductive strips 108 are then formed or otherwise deposited in the regions from which the SiO$_2$ layer have been removed. For example, conductive strips of PtSi may be formed by evaporative deposition of Pt over patterned SiO$_2$ on an Si substrate. Although the evaporated Pt will condense on all portions of diode layer 106, including non-conductive islands 110, the Pt on the top of non-conductive islands 110 does not form a diode, and therefore does not hinder operation of the present invention. At interfaces between the deposited Pt and the Si substrate, a platinum silicide forms upon heating. The Si/PtSi interface creates the depletion layer/active region of the detector. thus forming a diode such as diodes or diodic region 122. An overlayer 120 (omitted from FIG. 1 for clarity) of a metal or other electrical conductor is then deposited over the diode layer, thus establishing electrical contact (ohmic or Schottky) to diodes or diodic regions 122. This allows an alternative arrangement in which the crossed lines 108 are SiO$_2$ and the islands are PtSi.

Figure 3A:
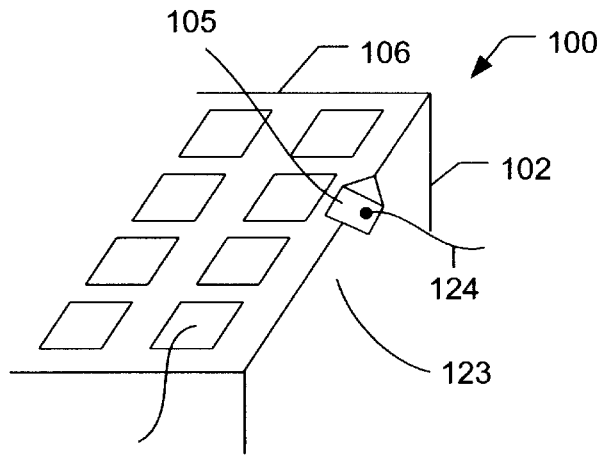
FIG. 3a and FIG. 3b, which are not to scale, show alternative zero-clearance or near physical contact schemes for attaching a device according to the present invention to a transmissive membrane.
Figure 3B:
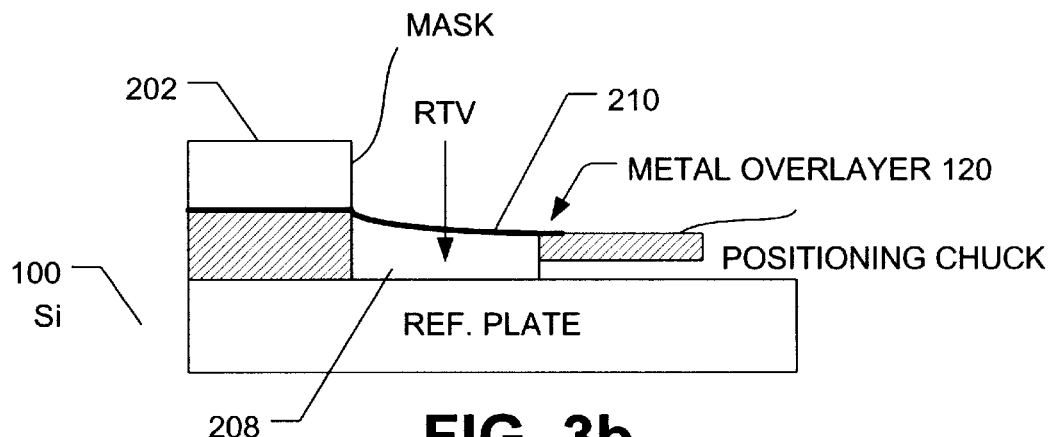
Figure 4:
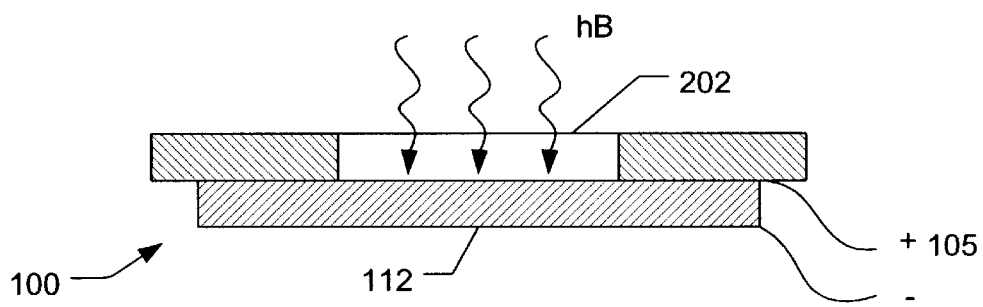
FIG. 4 is a not to scale cross-sectional view of a device according to the present invention as attached, with zero-clearance or near physical contact, to a transmissive membrane.

FIG. 3a and FIG. 3b show two different approaches that allow mounting of detector 100 with zero clearance or near physical contact between it and a transmissive membrane to be etched (see FIG. 4). In FIG. 3a, notch 105 is formed along the edge joining a non-diodic portion of diode layer 106 with side 123 of substrate 102. The inner surfaces of notch 105 are then made non-conducting (for example by oxidation). A terminus of electrically conducting wire 124 or a contact pad is then placed or attached in notch 105. Because the inner surfaces of the notch 105 are insulating, wire 124 or the contact pad is not in direct electrical contact with substrate 102. When diode layer 106 is coated with electrically conducting overlayer 120, the electrically conducting overlayer 120 establishes direct electrical contact between wire 105 and the upper surfaces of diodes or diodic regions 106. Thus wire 124 or contact pad and ohmic backside contact 112 bias diodic layer 106 with respect to substrate 102. Typically, the applied bias is a reverse bias, however a forward bias may also be used.

FIG. 3b shows another way of mounting detector 100 according to the present invention to a transmissive membrane with zero clearance or near physical contact. The perimeter of edges of detector 100 are surrounded with a potting compound 208 (such as RTV) to a depth of less than that of detector 100, thus forming a well 210 about the perimeter of detector 100. Diode layer 106 is coated with conducting overlayer 120 and conductive overlayer 120 extends into well 210. A wire, contact pad, or the like (not shown) may be attached to the portion of overlayer 120 covering well 210, away from the interface between transmissive membrane 202 and device 100.

Having described the invention, the following examples are given to illustrate specific applications of the invention including the best mode now known to perform the invention. These specific examples are not intended to limit the scope of the invention described in this application.

EXAMPLES

Example 1

Method of manufacturing a diode array consisting of a pattern of spaced discrete Schottky interfaces surrounded by an interconnected, punctuated, inactive region, for use as a position detector for a scanning energetic electron beam.

A clean silicon wafer, with orientation <100> and doped n-type with conductivity of 1–10 Ω-cm, was used as a substrate. A silicon oxide film on the surface, 700 nm thick, was formed by heat treatment in a moist oxygen atmosphere of 1050° C. for 75 minutes. The desired diode pattern was formed in the oxide by imaging a photographic mask (chrome-on-quartz) onto a photoresist material plated on the oxide, developing the resist, etching the exposed oxide in a buffered 7:1 hydrofluoric acid solution (1:7 in ammonium fluoride) and rinsing in de-ionized water. Immediately the oxide patterned wafer was loaded into a vacuum chamber for platinum deposition onto the wafer. After evacuation to a vacuum of better than $1\times10^{-6}$ torr, a 30 nm thick layer of platinum was deposited treatment in argon of 450° C. for 30 minutes to allow the platinum to diffuse into the silicon, forming the silicide. After silicide formation, excess platinum (such as that covering the oxide) and unreacted platinum (such as that still existing on top of the silicide) was removed by etching in aqua regia solution. A 100 µm thick uniform layer of Al was deposited over the substrate surface so as to make a uniform contact to the diode array. An ohmic contact to the substrate was formed by depositing a uniform 1000 nm thick layer of aluminum on the reverse side of the wafer, and annealing to 400° C. for 30 minutes. The resulting rugged photodiode was utilized by making electrical contacts to the metallic Al layer on the reverse side of the wafer and the metallic PtSi layer on the obverse.

Example 2

Method of manufacturing a diode array consisting of a pattern of spaced discrete inactive regions surrounded by an interconnected, punctuated, photodiode, for use as a position detector for an energetic scanning electron beam.

Example 1 was repeated, except that rather than forming an array of discrete Schottky interfaces surrounded by an interconnected punctuated inactive region, the opposite tone pattern was formed, in which there existed an array of discrete inactive regions surrounded by an interconnected punctuated Schottky interface. In this example, the Al overlayer was not needed. Rather, an electrical contact was made to a point at the perimeter of the silicide conducting layer.

Example 3

Method of manufacturing a diode array consisting of a pattern of spaced discrete inactive regions surrounded by an interconnected, punctuated, photodiode, for use as a scanning focused uv photon beam position detector.

Example 2 was repeated, but rather than a 30 nm thick layer of Pt, a 5 nm thick layer was deposited.

Example 4

Method of manufacturing a diode array for use in environments wherein an electrical contact to the reverse surface of the substrate is not appropriate or desirable.

Example 1, Example 2, and Example 3 were each repeated, but here the ohmic contacts were not made on the reverse side of the wafer. Rather, prior to patterning the oxide with the diode pattern, a small portion of the oxide in an area not critical for pattern functionality was removed by etching in 7:1 buffered HF acid, exposing bare silicon. A 1 µm layer of Si with diffused phosphorus was deposited on the exposed region by means of heating to 900° C. in an atmosphere of flowing gaseous phosphine in $N_2$ for 30 minutes. This creates a region doped n+. Excess phosphorus was removed in a two minute etch in 7:1 buffered HF acid. Subsequent selective deposition of 100 nm of Al on the n+ region allowed an ohmic contact to be formed on the obverse surface of the wafer, electrically isolated from the Schottky contact on the majority of the obverse surface except through the diode interface. Electrical contacts to the isolated metallic layer and the metallic PtSi layer, both on the obverse side of the wafer completed the diode assembly.

Example 5

Method of manufacture of a diode array but subject to the design constraint that no portion of the diode, including the metal interconnect to the silicide element, extends above or otherwise breaks the plane formed by the obverse face of the substrate.

A wafer as described in Example 1 was subjected to the oxidation treatment as described in Example 1. A 200 µm by 400 µm area located on the wafer surface so as to be cut in a subsequent wafer sawing step was opened and selectively etched by immersion in a 7:1 buffered HF acid solution, exposing bare silicon. The subject wafer was then cleaned and immersed in a 1 molar solution of potassium hydroxide so as to etch out a pit in a controlled manner into the substrate. The sidewalls of this pit were constrained by the crystal structure of the <100> silicon surface to be at 57.4° angles from the surface, while the bottom of the pit remained parallel with the wafer surface while at an increasing separation from the wafer surface. After formation of the pit, the oxide was stripped and subsequent processing as described in Example 1 was repeated with the exception that in this case, the deposited metal overlayer was also deposited down at least one side wall of the pit to the floor and was used as a contact point to connect an otherwise free standing wire without breaking the substrate obverse plane.

Example 6

Method of manufacture of a diode array with both electrical connections on the obverse face, but subject to the design constraint that no portion of the diode, including both the metal interconnects to the diode elements, extend above or otherwise break the planes formed by the obverse face of the substrate.

The subject wafer was processed to form two pits as otherwise initially described in Example 5. An obverse face contact to the substrate as described in Example 4 was fabricated. Subsequent processing continued as described in Example 5 with the exception that in this case two discrete metal overlayers were deposited so as to connect individually the substrate contact at the diffusion, and the diode contact, to the bottom of the pits, and to be further used as points to connect otherwise free standing wires without breaking the obverse substrate plane.

Example 7

Method of application of a diode constructed as per Example 5 for position drift measurements of a focused 75 keV electron beam as could be used during manufacture of a thin-membrane type mask as used in X-ray lithography.

The diode patterns employed consisted of a regular two dimensional array of round dots spaced on a 16 µm pitch, with either inactive regions surrounded by a monolithic punctuated diode as described in Example 2, or discrete diodes surrounded by a punctuated inactive region as described in Example 1, comprising the dots. The diode assembly so constructed was positioned and rigidly but removably attached to the mask with a separation between the obverse face of the detector and the underside of the membrane of no more that 25 µm. In operation, the electron beam was set so as to deliver a dose below the exposure threshold of the photoresist on the mask. The beam is then rastered over the mask in an area to be subsequently patterned. Said rastering consisted of 128 rows with 128 points per row, spaced 200 nm apart. The beam incident on the membrane was largely transmitted unattenuated through to the detector beneath, albeit with considerable forward scattering. The beam generated a signal in the detector proportional to that portion of the beam which was incident on active regions of the detector. Using the computer program described in the attached Appendix, this signal was sampled and recorded by a computer along with the nominal X and Y position of the beam. Using that same program, the signal intensities were mapped into a 128×128 array according to the position. Again using the same program, this information was then processed with a two dimensional fast Fourier Transform, and the phases at the period of the grid were extracted, in this case, by averaging the phases between the 2nd and 3rd bins of the transformed data in X and Y. These calculated phases were then recorded. The process was repeated, calculating new phases using the computer program disclosed in the Appendix. The program described in the CDROM Appendix converted the phase differences into distances by multiplying by the spatial period of 16 µm. These calculated values corresponded to position change of the detector, and hence the mask, with respect to the beam.

Obviously, many modifications and variations of the present invention are possible in light of the above teachings. It is therefore to be understood that, within the scope of the appended claims, the invention may be practiced otherwise than as specifically described.

What is claimed is:

1. A fiducial high energy beam detector, comprising:
   a conductive layer that transmits said high energy beam without scattering thereof;
   a diode layer supported upon a semiconducting substrate, said diode layer including:
   (a) a diode in electrical contact with said conductive layer and surrounding a non-diodic region of said diode layer, said diode producing a current in response to an incident high energy beam and being defined by an interface that forms a depletion layer region on a portion of an upper surface of said substrate; or
   (b) a plurality of diodes in contact with said conductive layer and arranged in a non-random distribution so as to provide said diode layer with at least one non-diodic region and a plurality of diode regions, each of said diodes producing a current in response to an incident high energy beam and being defined by an interface that forms a depletion layer region on a portion of an upper surface of said substrate; and
   an ohmic contact to the substrate, said ohmic contact being biased with respect to said conducting layer.

2. The fiducial high energy beam detector of claim 1, wherein said upper surface of said substrate includes at least one non-conductive region at a location other than that of a depletion region.

3. The fiducial high energy beam detector of claim 2, wherein said non-conductive region is at an edge formed by a joint between said upper surface of said substrate and a side of said substrate.

4. The fiducial high energy beam detector of claim 3, wherein said non-conductive region comprises a notch at said edge, said notch having a metal deposited therein, said metal being in electrical contact with said conductive layer but being otherwise electrically isolated from said substrate.

5. The fiducial high energy beam detector of claim 1, wherein said substrate is an Si substrate.

6. The fiducial high energy beam detector of claim 1, wherein said depletion layer or said depletion layers are formed at an interface between a metal silicide and said Si substrate.

7. The fiducial high energy beam detector of claim 1, wherein said non-diodic regions of said diode layer are $SiO_2$ on said Si substrate.

8. The fiducial high energy beam detector of claim 1, wherein said conductive layer is Al.

9. A fiducial high energy beam detector, comprising:
   a conductive layer that transmits said high energy beam without scattering thereof;
   an array of diodes, in electrical contact with said conductive layer, that produces a current in response to an incident high energy beam, each of said diodes sharing a common semiconducting substrate and being defined by an interface that forms a depletion layer on a portion of said upper surface of said substrate corresponding to said diode; and
   an electrical contact to said substrate.

10. A fiducial high energy beam detector according to claim 9, wherein said upper surface of said substrate includes at least one non-conductive region at a location other than that of a depletion region.

11. The fiducial high energy beam detector of claim 10, wherein said non-conductive region is at an edge formed by a joint between said upper surface of said substrate and a side of said substrate.

12. The fiducial high energy beam detector of claim 11, wherein said non-conductive region comprises a notch at said edge, said notch having a metal deposited therein, said metal being in electrical contact with said conductive layer but being otherwise electrically isolated from said substrate.

13. The fiducial high energy beam detector of claim 9, wherein said substrate is an Si substrate.

14. The fiducial high energy beam detector of claim 9, wherein said depletion layer or said depletion layers are formed at an interface between a metal silicide and said Si substrate.

15. The fiducial high energy beam detector of claim 9, wherein said non-diodic regions of said diode layer are $SiO_2$ on said Si substrate.

16. The fiducial high energy beam detector of claim 9, wherein said conductive layer is Al.

17. A method of monitoring the position of a high energy beam with respect to a workpiece that is transmissive to said high energy being exposed to said beam, comprising:
   exposing a fiducial beam monitoring device fixed to and adjacent said workpiece to said high energy beam by transmitting said high energy beam through said workpiece while said high energy beam is being translated with respect to said workpiece, said fiducial beam monitoring device comprising:
   a conductive layer that transmits said beam without scattering thereof;
   a diode layer below said conductive layer and supported upon a semiconducting substrate, said diode layer having thereon a pattern formed by:
   (a) a diode in electrical contact with said conductive layer and surrounding a non-diodic region of said diode layer, said diode producing an electrical current when exposed to said high energy beam and being defined by an interface that forms a depletion layer region on a portion of an upper surface of said substrate; or
  (b) a plurality of diodes in contact with said conductive layer and arranged in a non-random distribution so as to provide said diode layer with at least one non-diodic region and a plurality of diode regions, each of said diodes producing an electrical current in when exposed to said high energy beam and being defined by an interface that forms a depletion layer region on a portion of an upper surface of said substrate; and
an ohmic contact to the substrate, said ohmic contact being biased with respect to said conducting layer; and
corresponding electrical current changes within said detector that occur during said translation with the position of said beam relative to said pattern on said diode layer to determine the actual position of said beam relative to said pattern on said diode layer.

18. The method of claim 17, further comprising the step of comparing the determined position of said beam with respect to said pattern with an expected position of said beam with respect to said pattern.

19. The method of claim 18, further comprising the step of adjusting said translation of said beam to compensate for any difference between said determined position and said expected position.

20. The method of claim 17 wherein said diode layer includes a conductive overlayer, and said device is mounted so that said conductive overlayer is no more than about 10 $\mu$m from said workpiece.

* * * * *